United States Patent
Park

(10) Patent No.: US 10,930,789 B2
(45) Date of Patent: Feb. 23, 2021

(54) DISPLAY APPARATUS AND METHOD OF MANUFACTURING THE SAME

(71) Applicant: Samsung Display Co., Ltd., Yongin-Si (KR)

(72) Inventor: Sangil Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/985,893

(22) Filed: May 22, 2018

(65) Prior Publication Data

US 2018/0269328 A1 Sep. 20, 2018

Related U.S. Application Data

(62) Division of application No. 15/135,746, filed on Apr. 22, 2016, now Pat. No. 10,008,610.

(30) Foreign Application Priority Data

Aug. 31, 2015 (KR) ........................ 10-2015-0123192

(51) Int. Cl.
*H01L 25/16* (2006.01)
*H01L 25/075* (2006.01)
*H01L 33/20* (2010.01)
*H01L 33/00* (2010.01)
*H01L 27/12* (2006.01)
*H01L 27/15* (2006.01)
*H01L 29/786* (2006.01)

(52) U.S. Cl.
CPC ...... *H01L 29/7869* (2013.01); *H01L 25/0753* (2013.01)

(58) Field of Classification Search
CPC ........................ H01L 27/1248; H01L 25/0753
See application file for complete search history.

(56) References Cited

U.S. PATENT DOCUMENTS

| 7,888,690 | B2 | 2/2011 | Iwafuchi et al. | |
|---|---|---|---|---|
| 2002/0064032 | A1 | 5/2002 | Oohata | |
| 2005/0006794 | A1* | 1/2005 | Kashiwagi | C08L 83/04 257/788 |
| 2011/0006316 | A1* | 1/2011 | Ing | G02F 1/133606 257/89 |
| 2011/0297980 | A1 | 12/2011 | Sugizaki | H01L 33/38 257/98 |
| 2012/0112220 | A1* | 5/2012 | West | H01L 33/486 257/98 |
| 2012/0193648 | A1 | 8/2012 | Donofrio | H01L 33/508 257/88 |

(Continued)

FOREIGN PATENT DOCUMENTS

| JP | 11-142878 A | 5/1999 |
|---|---|---|
| KR | 20020027253 A | 4/2002 |
| KR | 1020140042320 A | 4/2014 |

*Primary Examiner* — Omar F Mojaddedi
(74) *Attorney, Agent, or Firm* — Cantor Colburn LLP

(57) ABSTRACT

A display apparatus includes a substrate, an emission layer on the substrate; a planarization layer between the substrate and the emission layer; and a thin-film transistor between the substrate and the planarization layer. The emission layer includes a light-emitting diode ("LED") electrically connected to the thin-film transistor, and a pixel separation member which surrounds the LED and is in contact with side surfaces of the LED.

11 Claims, 4 Drawing Sheets

(56) References Cited

U.S. PATENT DOCUMENTS

| | | | |
|---|---|---|---|
| 2014/0159064 A1* | 6/2014 | Sakariya | H01L 25/0753 257/88 |
| 2014/0367633 A1* | 12/2014 | Bibl | G02F 1/133603 257/13 |
| 2015/0137153 A1* | 5/2015 | Bibl | H01L 33/44 257/88 |
| 2015/0295146 A1* | 10/2015 | Ikegami | H01L 33/502 257/98 |
| 2016/0056204 A1* | 2/2016 | Sakariya | H01L 27/124 257/88 |
| 2016/0190105 A1* | 6/2016 | Rhee | H01L 25/0753 257/76 |
| 2017/0098742 A1 | 4/2017 | Ikegami | H01L 33/502 |

* cited by examiner

DISPLAY APPARATUS AND METHOD OF MANUFACTURING THE SAME

This application is a divisional application of U.S. application Ser. No. 15/135,746 filed Apr. 22, 2016, which claims priority to Korean Patent Application No. 10-2015-0123192, filed on Aug. 31, 2015, and all the benefits accruing therefrom under 35 U.S.C. § 119, the content of which in its entirety is herein incorporated by reference.

BACKGROUND

1. Field

One or more exemplary embodiments relate to a display apparatus and a method of manufacturing the same.

2. Description of the Related Art

A light-emitting diode ("LED") converts an electrical signal into light such as infrared rays or visible rays, according to the characteristics of a compound semiconductor. LEDs have been used for home appliances, remote controls, electronic display boards, various kinds of automated devices, and the like. LEDs have been widely used in electronic devices such as miniaturized handheld electronic devices and relatively large display apparatuses.

SUMMARY

One or more exemplary embodiments include a display apparatus and a method of manufacturing the same.

According to one or more exemplary embodiments, a display apparatus includes: a substrate; an emission layer on the substrate; a planarization layer between the substrate and the emission layer; and a thin-film transistor between the substrate and the planarization layer. The emission layer includes a light-emitting diode ("LED") electrically connected to the thin-film transistor, and a pixel separation member surrounding the LED and in contact with side surfaces of the LED. The pixel separation member may include an elastic material.

The pixel separation member may be a light blocking member.

The emission layer may define a flat upper surface thereof.

The LED may include a first semiconductor layer, a second semiconductor layer, and an intermediate layer between the first semiconductor layer and the second semiconductor layer. The emission layer may further include a first electrode pad under the first semiconductor layer, and a second electrode pad on the second semiconductor layer.

The display apparatus may further include a first electrode which is between the planarization layer and the light-emitting diode and electrically connected to the thin-film transistor. The first electrode pad may be in contact with the first electrode.

The display apparatus may further include a second electrode which is on the emission layer and in contact with the second electrode pad.

The second electrode may be on an entirety of the entire emission layer.

The display apparatus may further include a second electrode between the planarization layer and the LED and spaced apart from the first electrode between the planarization layer and the LED. The first electrode pad and the second electrode pad may be at a same side of the LED, the first electrode pad may be in contact with the first electrode, and the second electrode pad may be in contact with the second electrode.

In a top plan view, a planar area of the second semiconductor layer may be greater than a planar area of the first semiconductor layer and greater than a planar area of the intermediate layer. The second electrode pad in contact with the second electrode may not overlap the first semiconductor layer and the intermediate layer.

According to one or more exemplary embodiments, a method of manufacturing a display apparatus includes: disposing a plurality of light-emitting diodes ("LEDs") of an emission layer of the display apparatus spaced apart from each other at a first spacing on a carrier substrate; forming an elongation member of the emission layer between adjacent LEDs and in contact with side surfaces of the adjacent LEDs, on the carrier substrate; separating the carrier substrate from the plurality of LEDs and from the elongation member between and in contact with the adjacent LEDs; elongating the elongation member between and in contact with the adjacent LEDs to change the first spacing to a second spacing different from the first spacing, and transferring the plurality of LEDs spaced apart from each other at the second spacing onto a display substrate of the display apparatus.

The forming the elongation member may include filling an elastic material between the plurality of LEDs to fix the plurality of LEDs on the carrier substrate.

The transferring of the plurality of LEDs may include transferring the plurality of LEDs spaced apart from each other at the second spacing together with the elongated elongation member onto the display substrate, and the elongated elongation member transferred onto the display substrate may define a pixel separation member of the emission layer.

The elongation member may have a light blocking property.

The display substrate may include a substrate, a first electrode on the substrate, a planarization layer which is between the substrate and the first electrode and in which a via hole is defined, and a thin-film transistor between the substrate and the planarization layer. The method may further include electrically connecting the first electrode to the thin-film transistor through the via hole defined in the planarization layer. The transferring the plurality of light-emitting diodes may include overlapping the plurality of LEDs at the second spacing with the first electrode on the substrate of the display substrate.

Each of the LEDs may include a first semiconductor layer, a second semiconductor layer, and an intermediate layer between the first semiconductor layer and the second semiconductor layer. The method may further include disposing a first electrode pad of the emission layer, under the first semiconductor layer and in contact with the first electrode.

The method may further include disposing a second electrode on the emission layer, and disposing a second electrode pad of the emission layer, on the second semiconductor layer and in contact with the second electrode pad of the emission layer.

The forming of the second electrode may include disposing the second electrode on an entirety of the emission layer.

The method may further include disposing a second electrode on the substrate to dispose the planarization layer between the substrate and the second electrode, such that the second electrode is spaced apart from the first electrode, and disposing a second electrode pad of the emission layer, under the second semiconductor layer and in contact with the second electrode.

The method may further include exposing the second semiconductor layer from the first semiconductor layer and the intermediate layer by removing a portion of the first semiconductor layer and the intermediate layer. In the disposing the second electrode, the second electrode is disposed under the exposed portion of the second semiconductor layer such that the second electrode pad is at a same side of the LEDs as the first electrode pad.

BRIEF DESCRIPTION OF THE DRAWINGS

These and/or other advantages will become apparent and more readily appreciated from the following description of the exemplary embodiments, taken in conjunction with the accompanying drawings in which:

FIGS. 4(a) and 4(b) to FIG. 6 illustrate an exemplary embodiment of a method of manufacturing a display apparatus, according to the invention.

DETAILED DESCRIPTION

Figure 1:
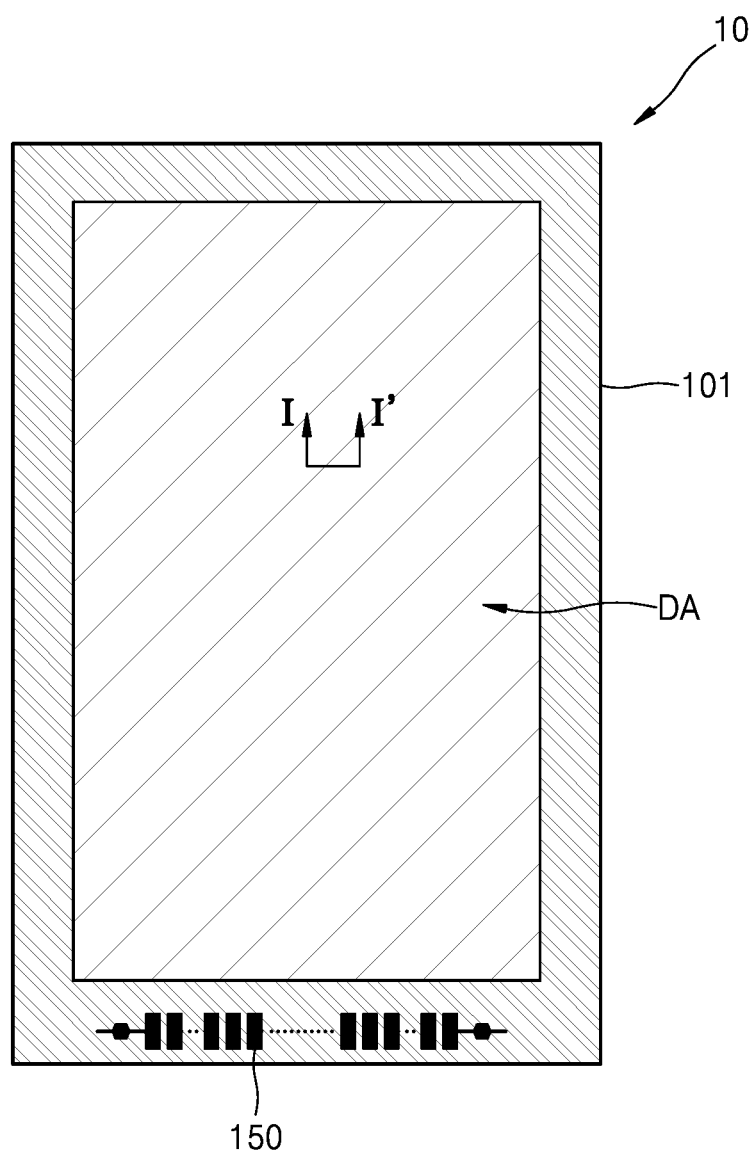
FIG. 1 illustrates a top plan view of an exemplary embodiment of a display apparatus according to the invention.

The invention may allow various kinds of change or modification and various changes in form, and specific embodiments will be illustrated in drawings and described in detail in the specification. However, it should be understood that the specific embodiments do not limit the invention to a specific disclosing form but include every modified, equivalent, or replaced one within the spirit and technical scope of the invention. In the following description, well-known functions or constructions are not described in detail so as not to obscure the invention with unnecessary detail.

Although terms, such as 'first' and 'second', can be used to describe various elements, the elements cannot be limited by the terms. The terms can be used to classify a certain element from another element.

The terminology used in the application is used only to describe specific embodiments and does not have any intention to limit the invention. An expression in the singular includes an expression in the plural unless they are clearly different from each other in context. In the accompanying drawings, some components are exaggerated, omitted, or schematically shown for convenience and clarity of description, and sizes of components do not fully reflect actual sizes thereof.

When each component is formed "on" or "under" a certain component, the terms "on" and "under" include directly or via another component in the middle, and a reference with respect to "on" and "under" is described with reference to the drawings. In contrast, when an element is referred to as being "directly on" or "directly under" another element, there are no intervening elements present.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
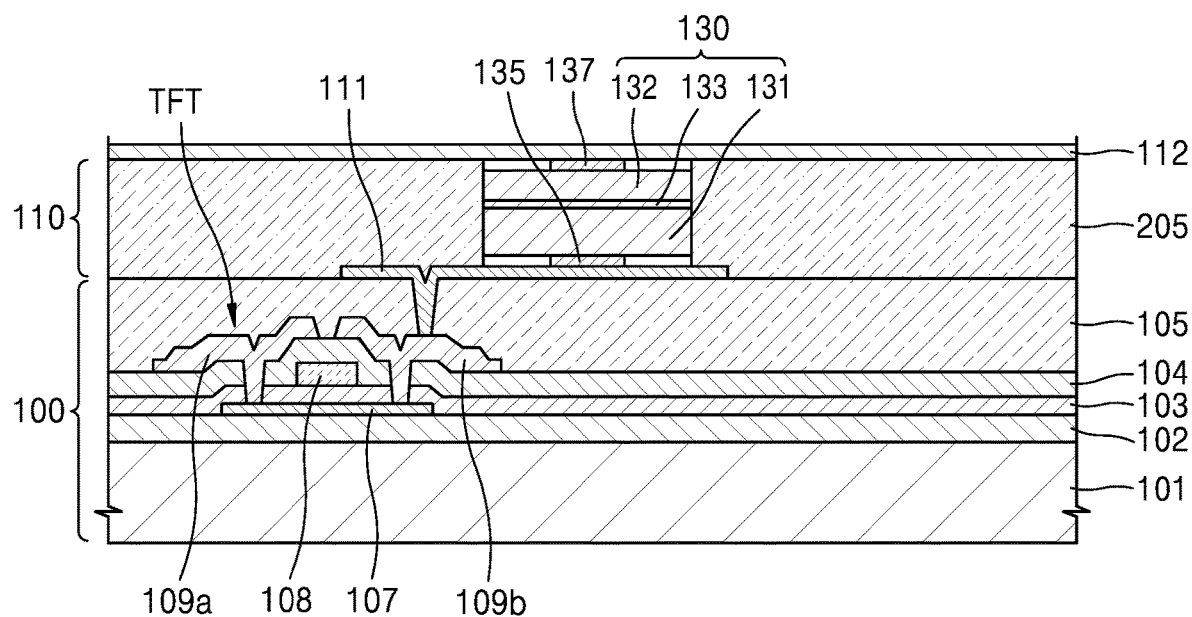
FIG. 2 illustrates a cross-sectional view of the display apparatus of FIG. 1, taken along line I-I', according to an exemplary embodiment of the invention.
Figure 3:
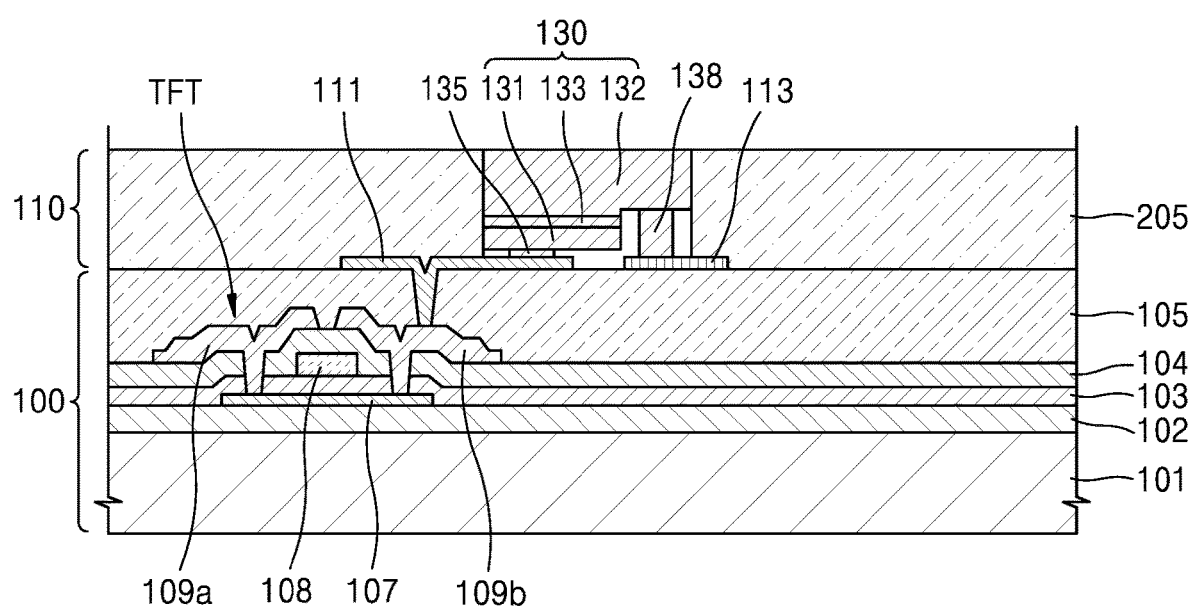
FIG. 3 illustrates a cross-sectional view of another exemplary embodiment of the display apparatus of FIG. 1, taken along line I-I', according to the invention.

FIG. 1 illustrates a top plan view of an exemplary embodiment of a display apparatus 10 according to the invention, FIG. 2 illustrates a cross-sectional view of the display apparatus 10 of FIG. 1, taken along line I-I', according to an exemplary embodiment of the invention, and FIG. 3 illustrates a cross-sectional view of another exemplary embodiment of the display apparatus 10 of FIG. 1, taken along line I-I', according to the invention.

Referring to FIGS. 1 and 2, the display apparatus 10 may include a display substrate 100 and an emission layer 110 which is on the display substrate 100.

The display substrate 100 may include a substrate 101, a thin-film transistor TFT on the substrate 101, and a planarization layer 105 on the thin-film transistor TFT. A first electrode 111 may be disposed or formed on the planarization layer 105 and may be connected to the thin-film transistor TFT through a via hole. Referring to FIGS. 2 and 3, the first electrode 111 is physically and/or electrically connected to the thin-film transistor TFT at the via hole defined in the planarization layer 105.

A display area DA in which an image is displayed and a non-display area which is disposed around the display area DA and in which an image is not displayed, may be defined on the substrate 101. The emission layer 110 may be disposed or formed in the display area DA, and a power wiring and the like may be placed in the non-display area. In addition, a pad unit 150 may be placed in the non-display area.

The substrate 101 may include various materials. In an exemplary embodiment, for example, the substrate 101 may include a transparent glass material of which a main component is silicon oxide ($SiO_2$). However, the substrate 101 is not necessarily limited thereto, and the substrate 101 may include a plastic material and thus have flexibility. The plastic material may be an insulating organic material including polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC"), cellulose triacetate ("TAC"), cellulose acetate propionate ("CAP"), or the like.

The display apparatus 10 may be a bottom emission type in which an image is realized in a direction toward the substrate 101. In the bottom emission type display apparatus 10, the substrate 101 includes or is formed of a transparent material. Alternatively, the display apparatus 10 may be a top emission type in which an image is realized in direction opposite the substrate 101. In the top emission type display apparatus 10, the substrate 101 does not include or is not formed of a transparent material, and may include a nontransparent material such as a metal.

When the substrate 101 includes a metal, the substrate 101 may include at least one of iron (Fe), chromium (Cr), manganese (Mn), nickel (Ni), titanium (Ti), molybdenum (Mo), stainless steel (SUS), an Invar alloy, an Inconel alloy, and a Kovar alloy but is not limited thereto.

A buffer layer 102 may be disposed or formed on the substrate 101. The buffer layer 102 may provide a flat surface at an upper part of the substrate 101 and block infiltration of foreign substances or humidity which travel through the substrate 101. In an exemplary embodiment, for example, the buffer layer 102 may include an inorganic material such as silicon oxide, silicon nitride, silicon oxynitride, aluminum oxide, aluminum nitride, titanium oxide, or titanium nitride and an organic material such as polyimide, polyester, or acryl. The buffer layer 102 may be formed with a stacked body including a plurality of the materials described above.

The thin-film transistor TFT may include an active layer 107, a gate electrode 108, a source electrode 109a and a drain electrode 109b.

Hereinafter, the thin-film transistor TFT as a top gate type in which the active layer 107, the gate electrode 108, the source electrode 109a and the drain electrode 109b are sequentially disposed or formed will be described. However, the invention is not limited thereto, and various types of thin-film transistors TFT, such as a bottom gate type, may be employed.

The active layer 107 may include a semiconductor material, e.g., amorphous silicon or polycrystalline silicon. However, the invention is not limited thereto, and the active layer 107 may include various materials. In one or more embodiments, the active layer 107 may include an organic semiconductor material and the like.

In one or more other embodiments, the active layer 107 may include an oxide semiconductor material. In an exemplary embodiment, for example, the active layer 107 may include an oxide of a material selected from 12-, 13-, and 14-group metal elements such as zinc (Zn), indium (In), gallium (Ga), tin (Sn), cadmium (Cd), and germanium (Ge) and a combination thereof.

A gate insulating layer 103 may be disposed or formed on the active layer 107. The gate insulating layer 103 insulates the gate electrode 108 from the active layer 107. The gate insulating layer 103 may be a monolayer (e.g., single layer structure) or a multi-layer structure including inorganic materials such as silicon oxide and/or silicon nitride.

The gate electrode 108 may be disposed or formed on the gate insulating layer 103. The gate electrode 108 may be connected to a gate line (not shown) in the display area DA and through which an on/off signal is applied to the thin-film transistor TFT. The gate line and the thin-film transistor TFT may be provided in plural in the display area DA.

The gate electrode 108 may include a relatively low-resistance metal material. The gate electrode 108 may include or be formed as a monolayer or a multi-layer including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account adhesion of such low-resistance metal material with respect to an adjacent layer, surface flatness of a layer to be stacked on the low-resistance metal material, processability of the low-resistance metal material, and the like.

An interlayer insulating layer 104 may be disposed or formed on the gate electrode 108. The interlayer insulating layer 104 insulates each of the source electrode 109a and the drain electrode 109b from the gate electrode 108, respectively. The interlayer insulating layer 104 may include or be formed as a monolayer or a multi-layer including an inorganic material. In an exemplary embodiment, for example, the inorganic material may be a metal oxide or a metal nitride. In an exemplary embodiment, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 109a and the drain electrode 109b may be disposed or formed on the interlayer insulating layer 104. The source electrode 109a and the drain electrode 109b may include or be formed as a monolayer or a multi-layer including at least one of Al, Pt, Pd, Ag, Mg, Au, Ni, Nd, Ir, Cr, Li, Ca, Mo, Ti, W, and Cu. The source electrode 109a and the drain electrode 109b may be disposed or formed to be in contact with a region of the active layer 107.

The planarization layer 105 may be disposed or formed on the thin-film transistor TFT. The planarization layer 105 may be disposed or formed to cover the plural thin-film transistors TFT such that a level difference due to the thin-film transistors TFT is compensated, and an upper surface of the planarization layer 105 is flat, thereby preventing malfunction of the emission layer 110 due to roughness under the emission layer 110.

The planarization layer 105 may include or be formed as a monolayer or a multi-layer including an organic material. The organic material may include a general-use polymer such as polymethylmethacrylate ("PMMA") or polystyrene ("PS"), a polymer derivative having a phenol group, an acrylic polymer, an imide-based polymer, an arylether-based polymer, an amide-based polymer, a fluorine-based polymer, a p-xylene-based polymer, a vinyl alcohol-based polymer, a blend thereof, or the like. Alternatively, the planarization layer 105 may include or be formed by a composite stacked body of an inorganic insulating layer and an organic insulating layer.

The first electrode 111 and the emission layer 110 are located on the planarization layer 105.

The first electrode 111 may be physically and/or electrically connected to the thin-film transistor TFT. In an exemplary embodiment, the first electrode 111 may be electrically connected to the drain electrode 109b through a contact hole defined or formed in the planarization layer 105. The first electrode 111 may be physically and/or electrically connected to the drain electrode 109b at the contact hole defined or formed in the planarization layer 105.

The first electrode 111 may have various shapes in the top plan view. In an exemplary embodiment, for example, the first electrode 111 may be disposed as or formed by being patterned in a discrete island shape.

The emission layer 110 may include a light-emitting diode ("LED") 130 electrically connected to the thin-film transistor TFT and a pixel separation member 205 which surrounds the LED 130.

The LED 130 may emit red, green or blue light or realize white light by using a fluorescent material or combining different colors. The LED 130 may include a first semiconductor layer 131, a second semiconductor layer 132, and an intermediate layer 133 between the first semiconductor layer 131 and the second semiconductor layer 132.

The first semiconductor layer 131 may be implemented by, for example, a p-type semiconductor layer. The p-type semiconductor layer may include or be formed using a semiconductor material having an empirical formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like and doped with a p-type dopant such as Mg, Zn, Ca, strontium (Sr), or barium (Ba).

The second semiconductor layer 132 may be implemented by, for example, an n-type semiconductor layer. The n-type semiconductor layer may include or be formed using a semiconductor material having an empirical formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like and doped with an n-type dopant such as Si, Ge, or Sn.

However, the invention is not limited thereto. In an alternative exemplary embodiment, the first semiconductor layer 131 may include an n-type semiconductor layer, and the second semiconductor layer 132 may include a p-type semiconductor layer.

The intermediate layer 133 is a region in which electrons and holes are re-coupled with each other, and the recoupling of the electrons and the holes causes transition to a low energy level, such that light having a wavelength corresponding to the energy transition is generated. The intermediate layer 133 may include or be formed with a semiconductor material having, for example, an empirical formula of $In_xAl_yGa_{1-x-y}N$ ($0 \leq x \leq 1$, $0 \leq y \leq 1$, $0 \leq x+y \leq 1$). The intermediate layer may be formed in a single quantum well ("SQW") structure or a multi quantum well ("MQW") structure. Alternatively, the intermediate layer 133 may include a quantum wire structure or a quantum dot structure.

The pixel separation member 205 may include a material which is elastic and/or deformable (hereinafter referred to as "an elongation material") and may be disposed or formed to be in contact with side surfaces of the LED 130 such that warping of a position of the LED 130 is reduced or effectively prevented. The pixel separation member 205 may include, for example, elastomeric silicone, elastomeric polyurethane, elastomeric polyisoprene, or the like and may further include light-absorbing particles such as carbon black dispersed therein.

The pixel separation member 205 may function as a light blocking member to block light emitted toward the side surfaces of the LED 130, thereby reducing or effectively preventing color mixing of lights generated from neighboring LEDs 130. In addition, the pixel separation member 205 may absorb or block light incident from outside the display apparatus 10, thereby improving actual contrast of the display apparatus 10.

A first electrode pad 135 may be disposed or formed under the first semiconductor layer 131, and a second electrode pad 137 may be disposed formed on (e.g., above) the second semiconductor layer 132. The first electrode pad 135 may be in contact with the first electrode 111. In addition, when the LED 130 has a vertical structure, the second electrode pad 137 may be located at a side opposite the first electrode pad 135, and a second electrode 112 in contact with the second electrode pad 137 may be disposed or formed on the emission layer 110. For purposes of description, the first electrode pad 135 and the second electrode pad 137 may be considered a portion of the LED 130 or a portion of the emission layer 110.

The first electrode 111 may include a reflective layer including Ag, Mg, Al, Pt, Pd, Au, Ni, Nd, Ir, Cr, or a combination thereof, and a transparent or translucent electrode layer disposed or formed on the reflective layer. The transparent or translucent electrode layer may include at least one of indium tin oxide ("ITO"), indium zinc oxide ("IZO"), zinc oxide ("ZnO"), indium oxide ($In_2O_3$), indium gallium oxide ("IGO"), and aluminum zinc oxide (AZO).

The second electrode 112 may be disposed extended or formed over an entirety of the emission layer 110. The second electrode 112 may be a transparent or translucent electrode, and may include a metal thin film having a relatively small work function and including Li, Ca, lithium fluoride (LiF)/Ca, LiF/Al, Al, Ag, Mg, or a combination thereof. In addition, an assistant electrode layer or a bus electrode may be further disposed or formed on the metal thin film such as by using a transparent electrode forming material such as ITO, IZO, ZnO, or $In_2O_3$. Therefore, the second electrode 112 may transmit light emitted from the LED 130.

However, the display apparatus 10 is not limited to the top emission type and may be a bottom emission type in which light emitted from the LED 130 is emitted toward the substrate 101. In the bottom emission type display apparatus 10, the first electrode 111 may be a transparent or translucent electrode, and the second electrode 112 may be a reflective electrode. Alternatively, the display apparatus 10 may be both a top and bottom emission type in which light is emitted in both of opposing directions, such as a front surface direction (toward the second electrode 112) and a rear surface direction (toward the substrate 101).

Although the vertical-type LED 130 for which the first electrode pad 135 and the second electrode pad 137 are located at opposite sides from each other has been described with reference to FIG. 2, the invention is not limited thereto. That is, as shown in FIG. 3, the LED 130 may be a lateral-type or flip-type LED 130 for which the first electrode pad 135 and a second electrode pad 138 are located to be oriented in a same direction, such as at a same side of the LED 130.

Referring to FIG. 3, the LED 130 may include the first semiconductor layer 131, the second semiconductor layer 132, and the intermediate layer 133 between the first semiconductor layer 131 and the second semiconductor layer 132. The first electrode pad 135 may be disposed or formed under the first semiconductor layer 131 and the second electrode pad 138 may be disposed or formed under the second semiconductor layer 132. Both the first electrode pad 135 and the second electrode pad 138 may be located to be oriented in a same direction, such as at a same side of the LED 130. For purposes of description, the first electrode pad 135 and the second electrode pad 138 may be considered a portion of the LED 130 or a portion of the emission layer 110.

To this end, referring to FIG. 3, a portion of the second semiconductor layer 132 may be exposed by the first semiconductor layer 131 and the intermediate layer 133, and the second electrode pad 138 may be disposed or formed under the exposed portion of the second semiconductor layer 132. That is, a planar area of the second semiconductor layer 132 may be greater than that of the first semiconductor layer 131 and that of the intermediate layer 133, and the second electrode pad 138 may be disposed or formed under the exposed portion of the second semiconductor layer 132 which protrudes outside boundaries of the first semiconductor layer 131 and the intermediate layer 133 in the top plan view. That is, in the top plan view, the second electrode pad 138 does not overlap the first semiconductor layer 131 and the intermediate layer 133.

A second electrode 113 in contact with the second electrode pad 138 as well as the first electrode 111 may be disposed or formed on the planarization layer 105. The second electrode 113 may be formed at a location spaced apart from the first electrode 111 and formed in and/or on the same layer as the first electrode 111 among layers disposed on the substrate 101.

As another example, an insulating layer (not shown) may be interposed between the second electrode 113 and the first electrode 111, and the insulating layer may define an opening thereof through which a portion of the first electrode 111 and/or the second electrode 113 is exposed. For this structure, the first electrode pad 135 disposed or formed under the first semiconductor layer 131 may be connected to the exposed portion of the first electrode 111, and the second electrode pad 138 disposed or formed under the second semiconductor layer 132 may be connected to the exposed portion of the second electrode 113.

Figure 4A:
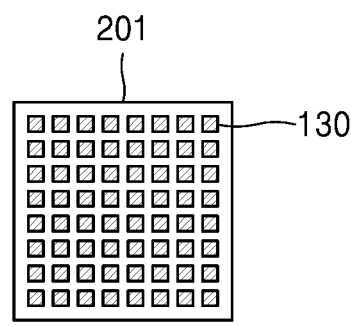
Figure 4B:
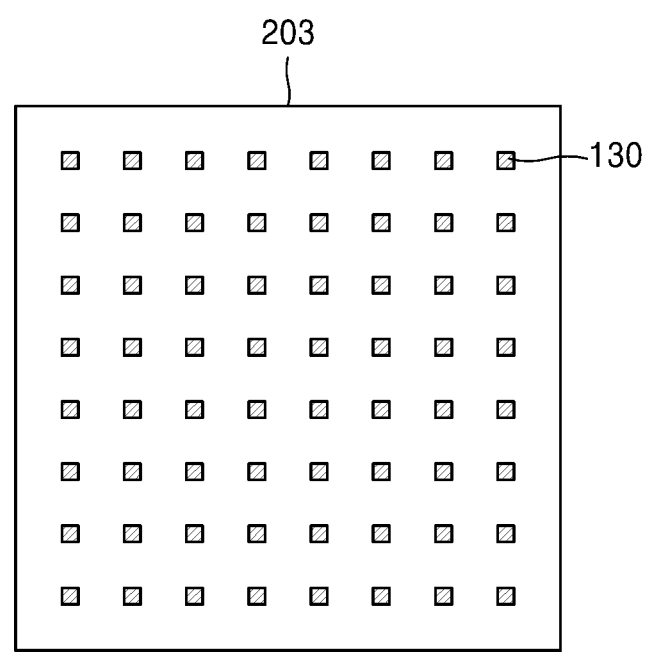
Figure 5:
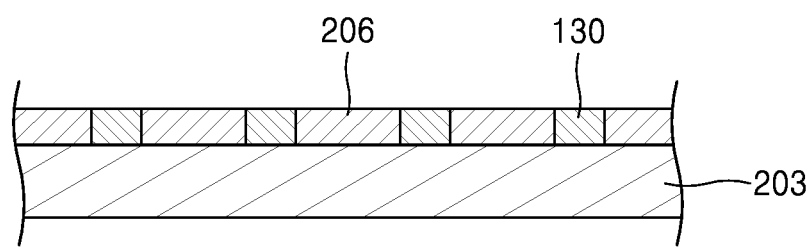
Figure 6:
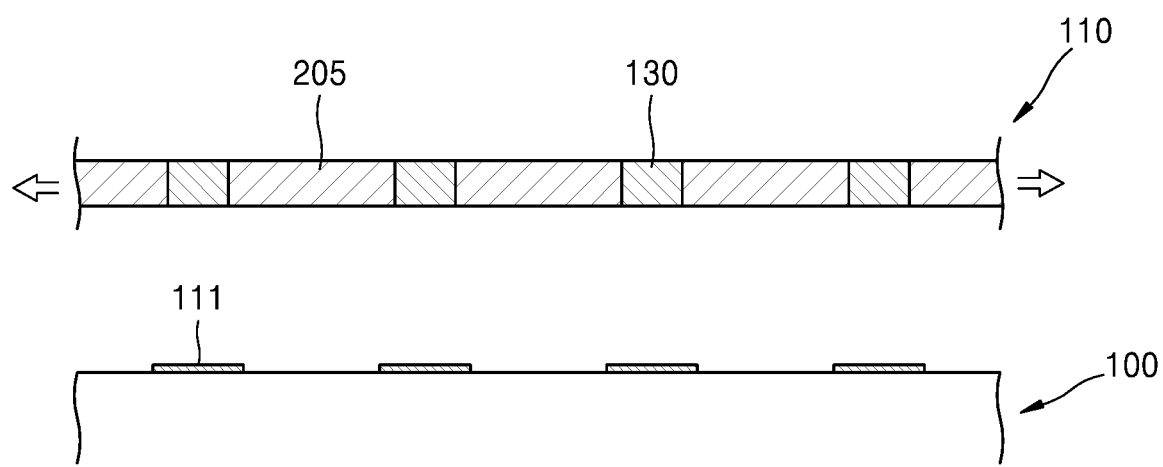

FIGS. 4(*a*) and 4(*b*) to FIG. 6 illustrate an exemplary embodiment of a method of manufacturing the display apparatus 10, according to the invention. The method will now be described with reference to FIGS. 2 to 6.

Referring to FIGS. 2, 4(*a*) and 4(*b*) to FIG. 6, the method may include arranging a plurality of LEDs 130 on a carrier substrate 203 to be spaced apart from each other, forming an elongation member 206 in contact with side surfaces of the plurality of LEDs 130 on the carrier substrate 203, separating the plurality of LEDs 130 and the elongation member 206 from the carrier substrate 203, and elongating the elongation member 206 with the LEDs 130 therebetween and then transferring the plurality of LEDs 130 to a target substrate such as the display substrate 100.

As shown in FIG. 4(*a*), the plurality of LEDs 130 may be formed on a base substrate 201. The base substrate 201 may be a conductive or insulating substrate including, for example, at least one of sapphire ($Al_2O_3$), silicon carbide (SiC), Si, gallium arsenide GaAs, GaN, ZnO, gallium phosphide (GaP), InP, Ge, and $Ga_2O_3$.

Each of the plurality of LEDs 130 may include the first semiconductor layer 131, the second semiconductor layer 132, and the intermediate layer 133 between the first semiconductor layer 131 and the second semiconductor layer 132. The first semiconductor layer 131, the second semiconductor layer 132 and the intermediate layer 133 may be formed using a method such as metal organic chemical vapor deposition ("MOCVD"), chemical vapor deposition ("CVD"), plasma-enhanced chemical vapor deposition ("PECVD"), molecular beam epitaxy ("MBE") or hydride vapor phase epitaxy ("HVPE").

Referring to FIG. 2, for example, in forming the LEDs 130, the first electrode pad 135 may be formed under the first semiconductor layer 131, and the second electrode pad 137 may be formed on (e.g., above) the second semiconductor layer 132. For purposes of description, the first electrode pad 135 and the second electrode pad 137 may be considered a portion of the LED 130 or a portion of the emission layer 110.

Referring to FIG. 4(*b*), the plurality of LEDs 130 formed on the base substrate 201 may be separated from the base substrate 201 and arranged on the carrier substrate 203 to be spaced apart from each other. Locations of the plurality of LEDs 130 on the carrier substrate 203 are temporarily fixed by an adhesive layer or the like. Spacing between LEDs 130 on the carrier substrate 203 may be different from that on the base substrate 201.

Thereafter, as shown in FIG. 5, the elongation member 206 is formed by filling an elongation material between the plurality of LEDs 130 spaced apart from each other and temporarily fixed on the carrier substrate 203. The elongation member 206 may be in contact with side surfaces of the plurality of LEDs 130 and fix locations of the plurality of LEDs 130 relative to each other. In a cross-sectional thickness direction taken from the upper surface of the carrier substrate 203, the elongation member 206 may be formed to be thicker than the plurality of LEDs 130, but the invention is not limited thereto.

The elongation material may be elastomeric silicone, elastomeric polyurethane, elastomeric polyisoprene, or the like and may further include light-absorbing particles such as carbon black dispersed therein. Therefore, the elongation member 206 may have a light blocking property.

Thereafter, as shown in FIG. 6, the plurality of LEDs 130 and the elongation member 206 are separated from the carrier substrate 203, the separated elongation member 206 is elongated or stretched, and then the plurality of LEDs 130 between elongated portions of the separated elongation member 206 are transferred to the display substrate 100.

The carrier substrate 203 may be separated from the plurality of LEDs 130 and the elongation member 206 using a well-known physical or chemical method. In an exemplary embodiment, for example, the carrier substrate 203 may be separated from the plurality of LEDs 130 and the elongation member 206 using a laser lift off ("LLO") method.

Where the plurality of LEDs 130 on the carrier substrate 203 are surrounded by the elongation member 206 and are connected to each other by the elongation member 206, even though the elongation member 206 separated from the carrier substrate 203 is elongated or stretched (refer to arrows in FIG. 6), the relative locations of the plurality of LEDs 130 may be maintained without being separated from the elongation member 206.

The elongation member 206 may be, for example, two-dimensionally elongated. That is, a planar area of the elongation member 206 increases, and accordingly, an initial spacing between adjacent LEDs 130 may also increase. Where an initial spacing between adjacent LEDs 130 is increased by elongating the elongation member 206 (refer to FIG. 5 compared to FIG. 6), the elongation member 206 may be elongated such that the spacing between the plurality of LEDs 130 corresponds to a spacing of a plurality of first electrodes 111 formed on the display substrate 100. With the spacing between the plurality of LEDs 130 corresponding to a spacing of or locations of a plurality of first electrodes 111 formed on the display substrate 100, then the plurality of LEDs 130 may be transferred onto the first electrodes 111 of the display substrate 100.

As another example, the elongation member 206 may be divided such that one column or row of the plurality of LEDs 130 is formed, and the one LED-column or one LED-row divided elongation member 206 is one-dimensionally elongated, such as along a length thereof, such that the spacing between the plurality of LEDs 130 corresponds to a spacing of a plurality of first electrodes 111 formed on the display substrate 100. With the spacing between the plurality of LEDs 130 on the one LED-column or one LED-row divided elongation member 206 corresponding to a spacing of or locations of a plurality of first electrodes 111 formed on the display substrate 100, then the plurality of LEDs 130 may be transferred to the display substrate 100.

The elongation member 206 may be transferred to the display substrate 100 in an elongated state together with the plurality of LEDs 130 thereon to form the pixel separation member 205. Therefore, since the elongated elongation member 206 forms the pixel separation member 205, another configuration or process for separating or defining a pixel within the display area DA is obviated. In addition, as described above, since the elongation member 206 has the light blocking property, the pixel separation member 205 may reduce or effectively prevent color mixing of lights generated by neighboring LEDs 130 and absorb or block light incident from outside the display apparatus 10, thereby improving actual contrast of the display apparatus 10.

When the elongation member 206 is elongated, a cross-sectional thickness of the elongation member 206 may decrease from an initial thickness thereof. Therefore, a cross-sectional thickness of the finally-formed pixel separation member 205 between the plurality of LEDs 130 and defined by the elongated elongation member 206 may be less than that of the plurality of LEDs 130. Thus, by taking into account this factor, the un-elongated elongation member 206 may be formed to have an initial thickness that is larger than a thickness of the plurality of LEDs 130. Accordingly, the finally-formed thickness of the pixel separation member 205 may be substantially the same as the thickness of the plurality of LEDs 130, and accordingly, the emission layer 110 may have a flat upper surface. The flat upper surface of the emission layer 110 may be defined by coplanar surfaces of the LED 130 and the pixel separation member 205. Therefore, since the emission layer 110 has the flat upper surface, a step difference is reduced or effectively prevented for layers to be formed on the emission layer 110.

In another exemplary embodiment of a method of manufacturing the display apparatus 10, according to the invention, the plurality of LEDs 130 may be transferred from the carrier substrate 203 by a method of primarily transferring the elongation member 206 in the elongated state thereof with the plurality of LEDs 130 therebetween to a surface of a roller, and then secondarily transferring the elongated elongation member 206 and the plurality of LEDs 130 therebetween to the display substrate 100 according to rolling of the roller with the elongated elongation member 206 and the plurality of LEDs 130 thereon. However, the invention is not limited thereto, and various methods may be used to transfer the plurality of LEDs 130 from the carrier substrate 203 to a display substrate 100.

Referring to FIG. 2, for example, after transferring the plurality of LEDs 130 to the display substrate 100, the second electrode pad 137 may be formed on the emission layer 110 and the second electrode 112 may be formed on the emission layer 110 to be in contact with the second electrode pad 137. The second electrode 112 may be formed, for example, on an entirety of the emission layer 110.

As described above, since all of the plurality of LEDs 130 may be transferred to the display substrate 100 at once such as within a single manufacturing process without being individually transferred, manufacturing efficiency of the display apparatus 10 may be improved.

While a method of transferring the vertical-type LED 130 in which the first electrode pad 135 and the second electrode pad 137 are located at opposite sides from each other has been described, the invention is not limited thereto. That is, referring to FIG. 3, another exemplary embodiment of a method of manufacturing the display apparatus 10 according to the invention, may include transferring lateral-type or flip-type LEDs 130 to the display substrate 100.

Each of the lateral-type or flip-type LEDs 130 shown in FIG. 3 includes the first semiconductor layer 131, the second semiconductor layer 132, and the intermediate layer 133 between the first semiconductor layer 131 and the second semiconductor layer 132. The first electrode pad 135 may be formed under the first semiconductor layer 131, and the second electrode pad 138 may be formed under the second semiconductor layer 132, such that both the first electrode pad 135 and the second electrode pad 138 may be located to be oriented in a same direction, such as at a same side of the LED 130. For purposes of description, the first electrode pad 135 and the second electrode pad 138 may be considered a portion of the LED 130 or a portion of the emission layer 110.

To this end, when the plurality of lateral-type or flip-type LEDs 130 are formed, mesa etching may be performed to remove a thickness portion of the first semiconductor layer 131 starting from a lower surface thereof, through the intermediate layer 133 and partially into a thickness of the second semiconductor layer 132 by a method such as reactive ion etching or the like to expose a portion of the second semiconductor layer 132. With the second semiconductor layer 132 exposed, then the second electrode pad 138 may be formed under the exposed second semiconductor layer 132.

In addition, both the first electrode 111 and the second electrode 113 are formed on the display substrate 100. The second electrode 113 is formed at a location spaced apart from the first electrode 111. The second electrode 113 may be formed on and/or in the same layer as the first electrode 111 among layers disposed on the substrate 101. In an exemplary embodiment, an insulating layer (not shown) is on and interposed between the second electrode 113 and the first electrode 111 spaced apart from each other, and an opening through which the first electrode 111 and/or the second electrode 113 is exposed may be formed in the insulating layer. Relative to the structure of the insulating layer on and interposed between the second electrode 113 and the first electrode 111 spaced apart from each other, the first electrode pad 135 disposed or formed under the first semiconductor layer 131 may be connected to the exposed portion of the first electrode 111, and the second electrode pad 138 disposed or formed under the second semiconductor layer 132 may be connected to the exposed portion of the second electrode 113.

Referring to FIGS. 4 to 6, the lateral-type or flip-type LEDs 130 may be formed on a base substrate and transferred to a target substrate such as the display substrate 100 by the same method as described above. In transferring the lateral-type or flip-type LEDs 130 from the base substrate to the target substrate, the first electrode pad 135 may be disposed in contact with the first electrode 111, and the second electrode pad 138 may be disposed in contact with the second electrode 113.

According to one or more embodiments, since a plurality of LEDs may be transferred to a target substrate such as the display substrate at once, manufacturing efficiency of a display apparatus may be improved. Since a pixel separation member is also formed when transferring the LEDs from the base substrate to the target substrate, another configuration or process for separating or defining pixels within the display area is obviated.

It should be understood that exemplary embodiments described herein should be considered in a descriptive sense only and not for purposes of limitation. Descriptions of features within each exemplary embodiment should typically be considered as available for other similar features in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a plurality of light-emitting diodes provided over the substrate;
a pixel separation member which is in contact with side surfaces of the plurality of light-emitting diodes and connects adjacent light-emitting diodes among the plurality of light-emitting diodes to each other;
a planarization layer between the substrate, and each of the plurality of light-emitting diodes, respectively; and
a plurality of thin-film transistors provided between the substrate and the planarization layer, each of a thin-film transistor among the plurality thin-film transistors electrically connected to a light-emitting diode among the plurality of light-emitting diodes,
wherein the pixel separation member and the plurality of light-emitting diodes do not overlap to each other along a vertical direction.

2. The display apparatus of claim 1, wherein the pixel separation member is a light blocking member including a carbon black.

3. The display apparatus of claim 1, further comprising a first electrode pad and a second electrode pad over the planarization layer, the first electrode pad and the second electrode pad being spaced apart from each other,
wherein the light-emitting diode comprises:
a first semiconductor layer,
a second semiconductor layer, and
an intermediate layer between the first semiconductor layer and the second semiconductor layer.

4. The display apparatus of claim 3, further comprising a first electrode which is between the planarization layer and the light-emitting diode and electrically connected to the thin-film transistor, and
wherein the first electrode pad is in contact with the first electrode.

5. The display apparatus of claim 4, further comprising a second electrode which is on the substrate and in contact with the second electrode pad.

6. The display apparatus of claim 5, wherein the second electrode is on an entirety of the substrate.

7. The display apparatus of claim 4, further comprising a second electrode between the planarization layer and the light-emitting diode and spaced apart from the first electrode which is between the planarization layer and the light-emitting diode,
wherein
the first electrode pad and the second electrode pad are at a same side of the light-emitting diode,
the first electrode pad is in contact with the first electrode, and
the second electrode pad is in contact with the second electrode.

8. The display apparatus of claim 7, wherein
the second semiconductor layer extends further than both an end of the first semiconductor layer and an end of the intermediate layer, and
the second electrode pad in contact with the second electrode does not overlap the first semiconductor layer and the intermediate layer.

9. The display apparatus of claim 4, wherein
the first electrode is provided in plurality to define a plurality of first electrodes separated from each other by a spacing along the substrate,
the pixel separation member comprises a single portion which contacts respective side surfaces of the adjacent light-emitting diodes and connects the adjacent light-emitting diodes to each other, and
a length along the substrate of the single portion corresponds to the spacing at which the plurality of the first electrodes are separated from each other.

10. The display apparatus of claim 1, wherein
the adjacent light-emitting diodes respectively include upper surfaces disposed furthest from the substrate,
the pixel separation member includes an upper surface corresponding to the upper surfaces of the adjacent light-emitting diodes, and
the upper surface of the pixel separation member is coplanar with the upper surfaces of the adjacent light-emitting diodes.

11. The display apparatus of claim 1, wherein the pixel separation member includes at least one of elastomeric silicone, elastomeric polyurethane and elastomeric polyisoprene.

* * * * *